United States Patent [19]

Schomburg et al.

[11] Patent Number: 5,034,972
[45] Date of Patent: Jul. 23, 1991

[54] METHOD OF PRODUCING THIN SHEETS AND USE OF SUCH SHEETS FOR THE PRODUCTION OF X-RAY MASKS

[75] Inventors: Werner Schomburg, Karlsruhe; Werner Schelb, Ransbach-Baumbach; Gerhard Stern, Pfinztal, all of Fed. Rep. of Germany

[73] Assignee: Kernforschungszentrum Karlsruhe GmbH, Karlsruhe, Fed. Rep. of Germany

[21] Appl. No.: 541,687

[22] Filed: Jun. 21, 1990

[30] Foreign Application Priority Data

Jun. 24, 1989 [DE] Fed. Rep. of Germany ....... 3920788

[51] Int. Cl.⁵ ............................................. G21K 5/00
[52] U.S. Cl. .......................................... 378/35; 430/5; 430/966
[58] Field of Search ............... 378/34, 35; 430/5, 966; 428/119, 457, 698; 29/17 R

[56] References Cited

U.S. PATENT DOCUMENTS

| 4,539,278 | 9/1983 | Williams et al. | 430/966 |
| 4,677,042 | 6/1987 | Kato et al. | 378/35 |
| 4,701,391 | 10/1987 | Lentfer et al. | |
| 4,837,123 | 6/1989 | Kato et al. | 430/5 |

FOREIGN PATENT DOCUMENTS 0104685 4/1984 European Pat. Off. .

OTHER PUBLICATIONS

Solid State Technology (SSTEAP 27 (9)), Sep. 1984, p. 194, "Advances in X-Ray mask Technology", A. R. Shimkunas.

Journal of the Electrochemical Society, vol. 128, No. 5, May 1981, pp. 1117–1118, "X-Ray Lithography Mask Technology", W. D. Buckley, J. F. Nesler & H. Windischmann.

Primary Examiner—Edward P. Westin
Assistant Examiner—David P. Porta
Attorney, Agent, or Firm—Spencer & Frank

[57] ABSTRACT

A method of producing thin sheets that are stretched over a frame and have planar and smooth surfaces with a low density of defects, and to the use of such sheets for the production of X-ray masks, wherein the sheet material is applied to a substrate through the intermediary of a release layer, whereupon the sheet is connected with the frame and separated from the substrate. During application of the release layer to the substrate, an area along the entire edge of the substrate is left free of the release layer material but is convered by the subsequently applied sheet material. Thereafter the sheet is connected with the frame in a region overlying the release layer and is severed around the periphery of the frame. Finally, the sheet and frame are released from the substrate and any release layer material remaining on the sheet is removed. The resulting sheet and frame arrangement may then be used to form an X-ray mask by applying desired X-ray absorber structures to the surface of the sheet. Alternatively the X-ray absorber structures may be formed on the surface of the sheet prior to attachment of the frame.

15 Claims, 2 Drawing Sheets

METHOD OF PRODUCING THIN SHEETS AND USE OF SUCH SHEETS FOR THE PRODUCTION OF X-RAY MASKS

REFERENCE TO RELATED APPLICATIONS

This application claims the priority of Federal Republic of Germany application Serial No. P 39 20 788.9 of June 24th, 1989, which is incorporated herein by reference.

BACKGROUND OF THE INVENTION

The present invention relates to a method of producing thin sheets which are stretched over a frame and have a planar and smooth surface with a low defect density and to the use of such sheets for the production of X-ray masks as defined in the preamble of claim 1.

The periodical *Solid State Technology* (SSTEAP 27 (9)), September 1984, pages 192-199, illustrates and describes, on page 194, in an article by A. R. Shimkunas, entitled "Advances in X-Ray Mask Technology," a method of manufacturing an X-ray mask blank of boron nitride. In this method, a silicon wafer is initially coated with boron nitride on all sides. Then the central region of the rear side is etched away until the silicon is exposed and the wafer is connected with a Pyrex ring. After being coated with polyimide and metallization of the frontal face, the silicon is etched away from the exposed rear side so that a mask blank results in which a membrane is stretched which can be processed further into an X-ray mask. However, this method can be employed only for such sheet or membrane materials which are not attacked by the etching medium. Titanium, for example, is also etched away by conventional etching media for silicon.

The periodical, *Journal of the Electrochemical Society*, Volume 128, No. 5, May, 1981, pages 1116-1120, discloses in an article by W. D. Buckley, J. F. Nesler and H. Windischmann, entitled "X-Ray Lithography Mask Technology," on pages 1117 and 1118, a method of producing a titanium membrane in which absorber structures of gold are applied to the membrane by galvanoplastic means. To accomplish this, a glass substrate is initially provided with a thin layer of gold onto which the titanium is then applied. The titanium membrane is connected with a ring and is mechanically separated from the glass substrate. Then, the membrane is stretched and connected with a supporting ring. The free stretching of the membrane, however, is a difficultly managed procedure. Moreover, in this method, the gold layer remains adhering to the titanium membrane so that the X-ray contrast with reference to the absorber structures is reduced. A similar method is disclosed in European published application EP-B1-0,104,685 corresponding to U.S. Pat. No. 4,701,391.

SUMMARY OF THE INVENTION

It is an object of the present invention to modify a method of the above type so that the sheet retains the stretched state impressed during its production for the subsequent method steps, with the sheet material being freely selectable within wide limits.

The above object is generally achieved according to the present invention by a method of producing a thin sheet or membrane of material which is stretched over a frame and which has a planar and smooth surface with a low defect density, which method is of the type wherein the sheet material is applied to a substrate through the intermediary of a release layer, whereupon the sheet is connected with the frame and thereafter is separated from the substrate; and wherein:

(a) during the application of the release layer to the substrate, an area along the edge of the substrate is left free of the release layer material but is covered by the subsequently applied sheet material;

(b) the frame is connected with the sheet within a region occupied by the release layer, and the sheet is severed around the periphery of the frame; and (c) the sheet with the attached frame are released from the substrate and any material of the release layer remaining on the sheet is removed.

Preferably, carbon is employed as the material for the release layer since it is easily released from the substrate and any remaining carbon residues on the sheet can be simply and cleanly removed in an oxygen plasma without adversely affecting the sheet surface since the sheet surface need not come in contact with any etching medium.

It is further proposed to produce X-ray masks by establishing the absorber structures on the sheet after step (a) and then to perform steps (b) and (c). This facilitates manipulation since the thin sheet is supported by the relatively stable substrate during this process.

One embodiment of the invention will now be described below with reference to the drawing.

BRIEF DESCRIPTION OF THE DRAWINGS

FIGS. 1A to 6A and 7, and FIGS. 1B to 6B are schematic cross-sectional and bottom plan views respectively illustrating the steps of the method according to the invention.

DETAILED DESCRIPTION OF THE PREFERRED EMBODIMENTS

Figure 1A:
Figure 1B:
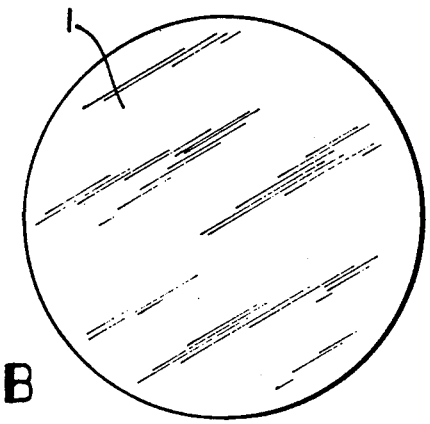
Figure 2A:
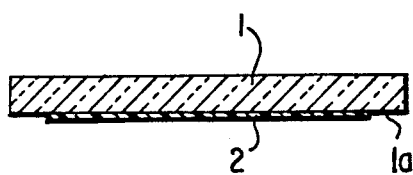
Figure 2B:
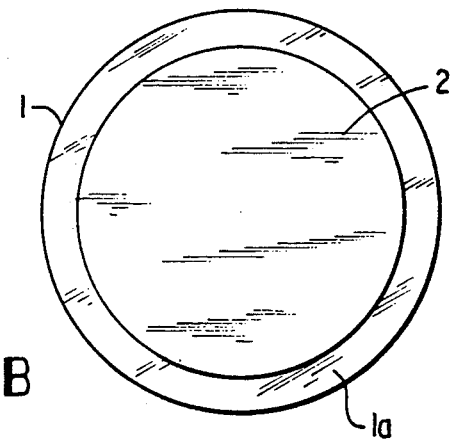
Figure 3A:
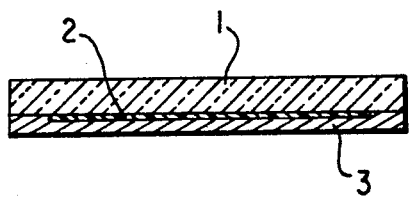
Figure 3B:
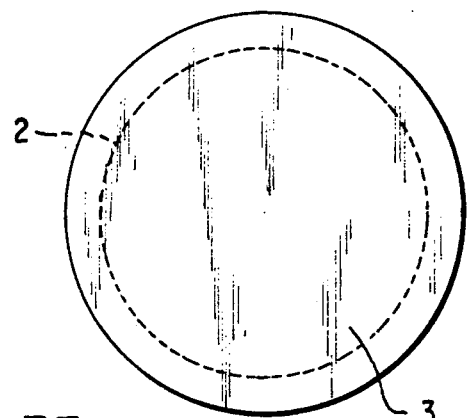

According to FIGS. 1A and 1B, the substrate 1 is composed of an extremely planar and smooth wafer, preferably silicon, having a thickness of 0.5 mm and a diameter of 100 mm. As shown in FIGS. 2A and 2B a release layer 2, preferably of carbon, is sputtered or vapor-deposited onto one surface side of this wafer 1 to a thickness of about 100 nm in a manner such that surface region (an annular surface region) of a width of about 1 mm along the edge of the substrate is left free of carbon. Thereafter, as shown in FIGS. 3A and 3B, a sheet 3 of a desired material, e.g. titanium, is sputtered onto the side of wafer 1 coated with the carbon layer 2 to a thickness of about 2 to 3 μm so that the sheet 3 also covers the carbon-free annular surface 1a along the edge of the wafer 1. Thus the sheet material 3 adheres to the silicon wafer 1 in the edge region 1a where the wafer surface is free of release material (carbon) 2 and thus retains its internal tensioned state as defined by the manufacturing conditions (particularly temperatures, type and pressure of the operating gas, power of the HF field, tempering temperature and duration).

Figure 4A:
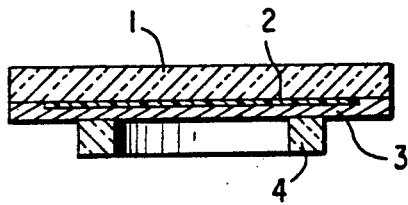
Figure 4B:
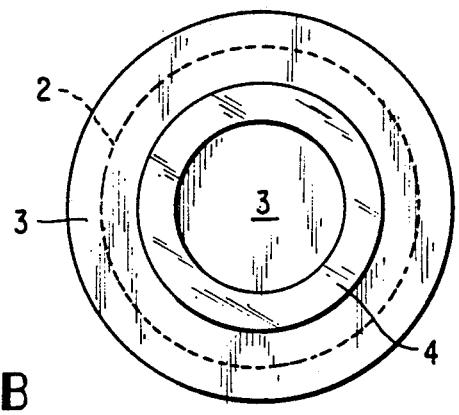
Figure 5A:
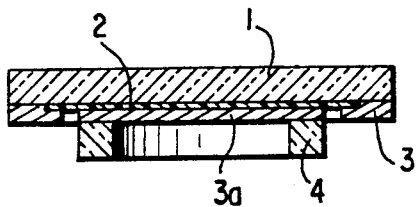
Figure 5B:
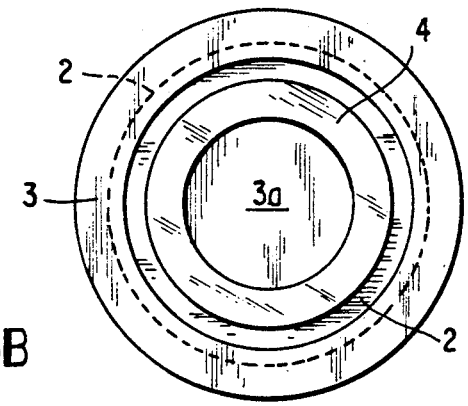
Figure 6A:
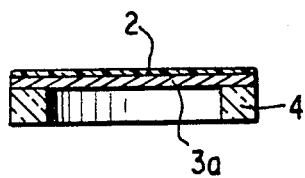
Figure 6B:
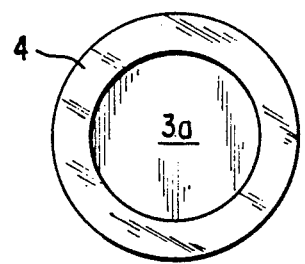
Figure 7:
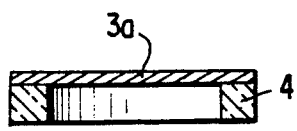

The thus tensioned sheet 3 is connected, for example by gluing, with a stable frame 4, e.g. of Pyrex and preferably in the form of a ring as shown in FIGS. 4A and 4B. When seen in cross section, frame 4 lies within the region occupied by the release layer 2. By scoring or etching, sheet 3 is severed around the periphery of frame 4 so that the sheet portion 3a stretched over frame 4 rests only on the carbon release layer 2, as can be seen in FIGS. 5A and 5B. Since the carbon of the release layer 2 adheres only slightly to the surface of the silicon wafer 1, sheet portion 3a together with frame 4 can be mechanically released from the silicon wafer 1 as shown in FIGS. 6A and 6B. Any remainder of carbon from release layer 2 still on sheet 3a can be removed by means of an oxygen plasma so that a sheet or membrane 3a results which is freely stretched over the frame 4 and has an extremely planar and smooth surface with a low density of defects as shown in FIG. 7. Since the carbon can be easily separated from the substrate 1 as well as from the sheet 3, the above mentioned prior art etching method is no longer required so that the material of sheet 3 can be freely selected within wide limits.

Figure 8:
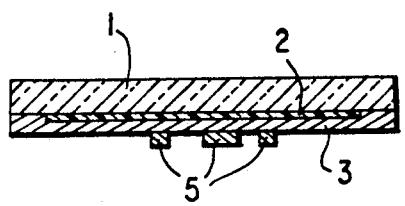
FIG. 8 is a schematic cross-sectional view illustrating a modification of the method according to FIGS. 1-7 to form an X-ray mask.

The thus produced framed sheet of FIG. 7, also called a mask blank, can now be further processed into an X-ray mask according to know methods by providing X-ray absorber structures on the surface of the sheet 3a within the area defined by the frame 4. However, these methods of producing the absorber structure can also be integrated into the method steps of the invention in that, as shown in FIG. 8, the absorber structures 5 required for the X-ray mask are produced on the surface of sheet 3, for example by known lithographic-galvanoplastic processes, immediately after application of the sheet material layer 3 to the surface of the substrate wafer 1 coated with the release layer 2. That is, the absorber structures are applied to the surface of the sheet 3 within the area to be surrounded by the frame 4 prior to the attachment of the frame 4 as shown in FIGS. 4A and 4B.

For the production of several smaller mask blanks on a joint large-area substrate, it is also possible to leave, for example, a honeycomb area of surfaces that are free of release layer material which are then jointly covered by the sheet material.

As a sheet material not only metals like titanium or aluminum but also compounds like aluminum nitride may be used. For the substrate material instead of silicon a glass plate may be used.

The invention now being fully described, it will be apparent to one of ordinary skill in the art that any changes and modifications can be made thereto without departing from the spirit or scope of the invention as set forth herein.

What is claimed:

1. A method of producing a sheet of material which is stretched over a frame and which has a planar and smooth surface with a low defect density, comprising the steps of:
    applying a layer of a release material to one surface of a substrate while leaving an area along the outer edge of the substrate free of release material;
    covering said release material layer and said release material layer free edge area of said substrate with a layer of the sheet material;
    connecting a frame to said layer of sheet material within a region occupied by the release layer;
    severing said layer of sheet material around the periphery of the frame;
    releasing the portion of the layer of sheet material connected to the frame from said one surface of substrate and from release material layer; and
    removing any release material remaining on the surface of said portion of said layer of sheet material.

2. A method as defined in claim 1 wherein the material of said release layer is a material which can be removed from the substrate as well as from the sheet material without adversely influencing the surface of the sheet.

3. A method as defined in claim 2, wherein carbon is used as the material for the release layer.

4. A method as defined in claim 3 wherein the substrate is formed of silicon and the sheet material is a metal.

5. A method as defined in claim 4 wherein the metal is titanium.

6. A method as defined in claim 1 wherein said sheet material is a material which is transparent to X-ray radiation.

7. A method as defined in claim 6 wherein said X-ray transparent material is a metal.

8. A method as defined in claim 1 wherein said frame is ring shaped.

9. A method as defined in claim 1 wherein said release layer has a thickness of about 100 nm, and said layer of the sheet material has a thickness of approximately 2-3 $\mu$m.

10. A method as defined in claim 1 wherein said substrate has a diameter of approximately 100 mm and said release material free edge has a width of about 1 mm.

11. A method according to claim 1 further comprising forming X-ray absorber structures on a surface of said layer of sheet material to provide an X-ray mask.

12. A method as defined in claim 1 further comprising prior to said step of connecting a frame, forming X-ray absorber structures on a portion of the surface of said layer of the sheet material which will be surrounded by the frame, whereby an X-ray mask is produced by said method.

13. A method of producing an X-ray mask comprising:
    applying a layer of a release material to one surface of a substrate while leaving an area along the outer edge of the substrate free of release layer material;
    covering said release material layer and said release material layer free edge area of said substrate with a layer of an X-ray transparent material;
    forming desired X-ray absorber structures on a portion of the surface of said X-ray transparent layer overlying said layer of release material;
    connecting a frame to said surface of said X-ray transparent layer in a region overlying said layer of release material and so as to surround said absorber structures;
    severing said layer of X-ray transparent material around the periphery of the frame;
    releasing the portion of said X-ray transparent layer connected to the frame from said one surface of said substrate and from said release material layer; and
    removing any release material remaining on the surface of said layer of X-ray transparent material.

14. A method as defined in claim 13 wherein said X-ray transparent material is a metal and said step of covering includes sputtering the metal.

15. A method as defined in claim 13 wherein said release material is carbon.

* * * * *